(12) United States Patent
Shi et al.

(10) Patent No.: US 8,933,534 B2
(45) Date of Patent: Jan. 13, 2015

(54) ISOLATION STRUCTURE OF HIGH-VOLTAGE DRIVING CIRCUIT

(75) Inventors: Longxing Shi, Jiangsu (CN); Qinsong Qian, Jiangsu (CN); Weifeng Sun, Jiangsu (CN); Jing Zhu, Jiangsu (CN); Xianguo Huang, Jiangsu (CN); Shengli Lu, Jiangsu (CN)

(73) Assignee: Southeast University (CN)

( * ) Notice: Subject to any disclaimer, the term of this patent is extended or adjusted under 35 U.S.C. 154(b) by 0 days.

(21) Appl. No.: 14/240,287

(22) PCT Filed: Aug. 14, 2012

(86) PCT No.: PCT/CN2012/080087
§ 371 (c)(1),
(2), (4) Date: Feb. 21, 2014

(87) PCT Pub. No.: WO2013/026363
PCT Pub. Date: Feb. 28, 2013

(65) Prior Publication Data
US 2014/0203406 A1  Jul. 24, 2014

(30) Foreign Application Priority Data
Aug. 23, 2011 (CN) .......................... 2011 1 0242932

(51) Int. Cl.
*H01L 21/761* (2006.01)
*H01L 29/36* (2006.01)
(Continued)

(52) U.S. Cl.
CPC .......... *H01L 29/0646* (2013.01); *H01L 21/265* (2013.01); *H01L 29/7835* (2013.01); *H01L 21/761* (2013.01); *H01L 21/823481* (2013.01); *H01L 29/0847* (2013.01); *H01L 29/1083* (2013.01); *H01L 29/0692* (2013.01)
USPC ........... 257/500; 257/544; 257/548; 438/294; 438/416; 438/419; 438/420; 327/434

(58) Field of Classification Search
USPC .......... 257/500, 544, 548; 438/294, 416, 419, 438/420; 327/566
See application file for complete search history.

(56) References Cited

U.S. PATENT DOCUMENTS 7,236,041 B2 *  6/2007  Kim et al. ...................... 327/434
7,655,979 B2     2/2010  Jeon et al. ..................... 257/335

(Continued)

FOREIGN PATENT DOCUMENTS

CN  101452933  6/2009  ............. H01L 27/06
CN  102306656  1/2012  ............. H01L 29/06

OTHER PUBLICATIONS

PCT International Search Report issued in corresponding application No. PCT/CN2012/080087, dated Nov. 22, 2012 (6 pgs).

*Primary Examiner* — Evan Pert
(74) *Attorney, Agent, or Firm* — Hayes Soloway P.C.

(57) ABSTRACT

An isolation structure of a high-voltage driving circuit includes a P-type substrate and a P-type epitaxial layer; a high voltage area, a low voltage area and a high and low voltage junction terminal area are arranged on the P-type epitaxial layer; a first P-type junction isolation area is arranged between the high and low voltage junction terminal area and the low voltage area, and a high-voltage insulated gate field effect tube is arranged between the high voltage area and the low voltage area; two sides of the high-voltage insulated gate field effect tube and an isolation structure between the high-voltage insulated gate field effect tube and a high side area are formed as a second P-type junction isolation area.

10 Claims, 5 Drawing Sheets

(51) Int. Cl.
   *H01L 29/06*      (2006.01)
   *H01L 21/265*     (2006.01)
   *H01L 29/78*      (2006.01)
   *H01L 21/8234*    (2006.01)
   *H01L 29/08*      (2006.01)
   *H01L 29/10*      (2006.01)

(56) References Cited

U.S. PATENT DOCUMENTS

| 7,834,575 B2 * | 11/2010 | Hauenstein | 318/569 |
| 2008/0074165 A1 | 3/2008 | Jeon et al. | 327/333 |

* cited by examiner

ISOLATION STRUCTURE OF HIGH-VOLTAGE DRIVING CIRCUIT

FIELD OF THE INVENTION

The present invention relates to a high-voltage half-bridge gate driving circuit in a high-voltage power integrated circuit, in particular to an isolation structure in an integrated high-voltage driving circuit.

BACKGROUND OF THE INVENTION

High-voltage gate driving circuits can be used in various fields, such as motor driving, electronic ballasts for fluorescent lamp, and power management, etc. The level shift circuit in a high-voltage gate driving circuit is a key component of the entire circuit, the electrical performance of high-voltage insulated gate field effect tube LDMOS elements constituting the level shift circuit and the electrical coupling between high-voltage LDMOS elements have influence on the performance of the level shift circuit, and the heavy current and high voltage of source electrode and drain electrode of the high-voltage LDMOS elements may cause a parasitic effect in other areas of the entire integrated circuit and thereby have influence on the electrical performance of the entire integrated circuit; therefore, the electrical performance of high-voltage LDMOS elements in a level shift circuit and the isolation of high-voltage LDMOS elements are undoubtedly important considerations in the research of performance and technique of high-voltage gate driving circuits. The design of isolation structures in high-voltage integrated circuits is always crucial in the design of high-voltage integrated circuits. However, withstand voltage and leak current are two major challenges in the design and technique of isolation structures. A high-voltage integrated circuit (HVIC) is a circuit that integrates new high-voltage power elements, high-voltage and low-voltage logic control circuits, and protection circuits in a single silicon chip. HVICs are of great significance for miniaturization, intellectualization, and power saving of the devices such as household electrical appliances and automobile electronics, owing to their advantages in system, such as high reliability, high stability, lower power consumption, small size, light weight, and low cost. A HVIC can be divided into high-side circuit, low-side circuit, and high-low junction terminal region. To prevent the impact of high-voltage circuit on nearby circuits, cross-impact between high-voltage power elements and high-voltage circuit, and crosstalk between elements, the isolation technology of a HVIC is the basis for normal and effective operation of the HVIC as well as a key component of a high-voltage/low-voltage compatible technical platform.

The isolation between high-voltage LDMOSs in level shift circuits is always the focus in the research of half-bridge driving circuits. A variety of isolation methods are used in existing half-bridge driving chips. Among these isolation methods, the most effective and the most prominent isolation method is the high-voltage LDMOS isolation method for high-voltage gate driving circuit mentioned in the U.S. Pat. No. 7,655,979 of Fairchild Semiconductor, wherein, the high-voltage gate driving circuit comprises a high-voltage (HV) region, a low-voltage (LV) region, and a HV-LV junction terminal region, the high-voltage LDMOS is located between the high-voltage region and the low-voltage region and employs partial junction terminal region as its drift region. The HV-LV junction terminal region and the low-voltage region, the high-voltage LDMOS and the high-voltage region/low-voltage region, and the high-voltage LDMOS and the HV-LV junction terminal region are isolated from each other with a p-n junction isolation structure composed of a P-type well and a P-type buried layer, i.e., around the entire high-voltage LDMOS, the high-voltage LDMOS is isolated from other parts of the circuit with a p-n junction isolation structure composed of a P-type well and a P-type buried layer, wherein, the p-n junction isolation is implemented with a P-type junction isolation composed of a P-type well on the epitaxial layer and a P-type buried layer below the P-type well and penetrating the epitaxial layer to the substrate; such a p-n junction isolation structure can isolate the high voltage LDMOS from other parts of the circuit nearby. However, when the high-voltage region is connected to high voltage, the P-type junction isolation region near the isolation part of high-voltage region can be depleted completely, while the P-type junction isolation region away from the isolation part of high-voltage region can't be depleted completely, resulting in a partial breakdown phenomenon. As a result, the withstand voltage of the entire isolation structure is decreased.

DISCLOSURE OF THE INVENTION

Technical Problem

The present invention provides an isolation structure of high-voltage driving circuit, which can solve the partial breakdown problem resulted from the fact that the P-type junction isolation region away from the high-voltage region can't be depleted completely in the prior art as well as increase the withstand voltage of isolation structure.

SOLUTION TO THE PROBLEM

Technical Solution

The present invention employs the following technical solution:

An isolation structure of high-voltage driving circuit, comprising: a P-type substrate; a P-type epitaxial layer arranged on the P-type substrate; a low-voltage region and a high-voltage region arranged on the P-type epitaxial layer; a HV-LV junction terminal region arranged between the high-voltage region and the low-voltage region; a first P-type junction isolation region arranged between the HV-LV junction terminal region and the low-voltage region, said first P-type junction isolation region being composed of a P-type buried layer and a first P-type well; a second P-type junction isolation region arranged in the interior zone of the first P-type junction isolation region, working with the first P-type junction isolation region to enclose an isolated region; a high-voltage insulated gate field effect transistor (IGFET) arranged in the isolated region, utilizing the HV-LV junction terminal region as its drift region; wherein, the high-voltage region is partially located in the isolated region, the partial high-voltage region in the isolated region comprises a first N-type deep well arranged in the P-type substrate and a first N-type well region arranged in the P-type epitaxial layer, and the N-type well region is on the top surface of the first N-type deep well; the partial high-voltage region outside of the isolated region comprises a second N-type deep well arranged in the P-type substrate and a second N-type well region arranged in the P-type epitaxial layer, and the N-type well region is on the top surface of the second N-type deep well; the first N-type deep well extends towards and into the HV-LV junction terminal region, and the second N-type deep well extends towards and into the HV-LV junction terminal region, wherein, the second P-type junction isolation region is a second P-type well region arranged in the P-type epitaxial layer, and the second P-type well region is arranged on the surface of the P-type substrate; the second P-type well region in a part of the second P-type junction isolation region in the HV-LV junction terminal region is substituted by a N-type well region, and the N-type well region is on the P-type epitaxial layer and is surrounded by the second P-type well region; the implanted area of the N-type well region in unit area of the second P-type junction isolation region increases gradually in the direction from the high-voltage region to the low-voltage region.

BENEFICIAL EFFECTS OF THE INVENTION

Beneficial Effects

Figure 10:
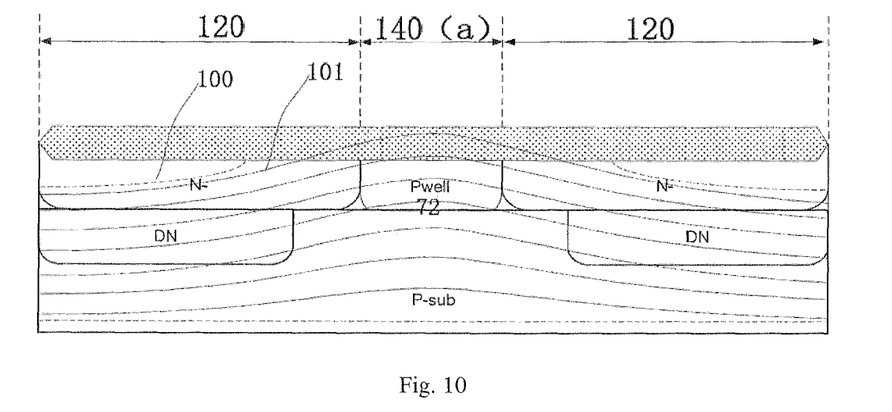
FIG. 10 is a schematic diagram of equipotential lines of an isolation structure without N-type buried layer region when high voltage is applied across the isolation structure, indicating that the P-type junction isolation region is depleted completely, wherein, the dotted line 100 represents the boundary of the depletion region, and the solid lines 101 represent equipotential lines.

The isolation structure for high-voltage driving circuit is compatible with the existing process; in addition, compared with other existing isolation techniques, the present invention has the following advantages:

(1) In the conventional structure, the isolated region (high-voltage IGFET) is isolated by a surrounding annular P-type junction isolation region, and is isolated from the nearby HV-LV junction terminal region by a high-concentration P-type deep well isolation structure or a P-type junction isolation structure composed of a P-type buried layer and a P-type well region, which is to say, all isolation structures from the high-voltage region to the low-voltage region are P-type junction isolation structures with the same concentration; when the high-voltage region is connected to high voltage, the high-voltage potential decreases gradually along the drift region; since the potential in the high-voltage region is very high, the P-type junction isolation structure in the isolation part near the high-voltage region can be depleted completely, and the breakdown voltage is very high (see FIG. 10); however, owing to the withstand voltage, the potential decreases gradually in the drift region, and the potential across the isolation structure away from the high-voltage region is not high enough to deplete completely the P-type junction isolation structure, and partial breakdown may occur in the isolation structure; consequently, the withstand voltage of the entire isolation structure is decreased finally. In the present invention, a N-type well region with varying implantation windows is arranged in the P-type junction isolation region away from the high-voltage region, so that the concentration of the second P-type well region decreases gradually in the direction from the high-voltage region to the low-voltage region, and all P-type junction isolation structures at different potentials can be deplete completely; therefore, the breakdown voltage of the isolation structure is increased, partial breakdown is inhibited, and the isolated part is effectively isolated from the surrounding parts.

(2) In the present invention, the implantation windows of the N-type well region can be arranged flexibly, as long as the arrangement ensures the concentration of the second P-type well region decreases gradually from the high-voltage region to the low-voltage region and the entire P-type junction isolation structure will not be broken down in ON state.

(3) The present invention is compatible with the existing process, and can be prepared simply without any additional processing step.

EMBODIMENTS OF THE PRESENT INVENTION

Detailed Description of the Embodiments

Embodiment 1

Figure 1:
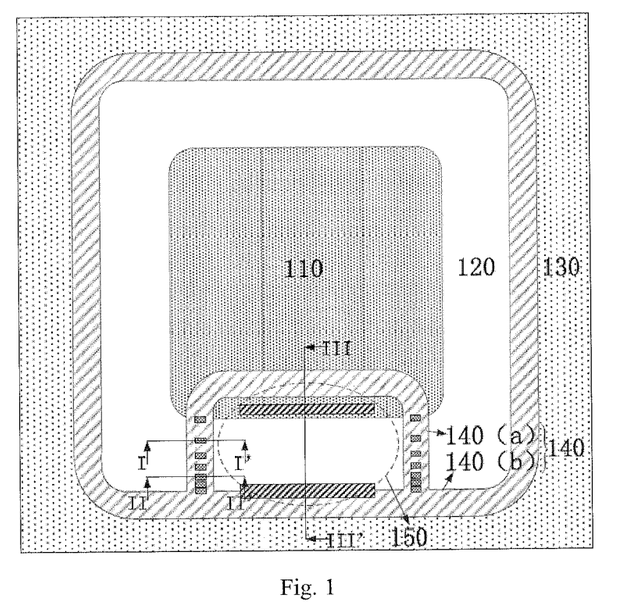
FIG. 1 is a schematic diagram of the isolation structure for high-voltage gate driving circuit that includes a high-voltage insulated gate field effect transistor (IGFET) in the present invention, wherein, 150 is a high-voltage lateral IGFET.

An isolation structure of high-voltage driving circuit, comprising: a P-type substrate 1; a P-type epitaxial layer 2 arranged on the P-type substrate 1; a low-voltage region 130 and a high-voltage region 110 arranged on the P-type epitaxial layer 2; a HV-LV junction terminal region 120 arranged between the low-voltage region 130 and the high-voltage region 110; a first P-type junction isolation region 140a arranged between the HV-LV junction terminal region 120 and the low-voltage region 130, said first P-type junction isolation region 140a being composed of a P-type buried layer 4 and a first P-type well 71; a second P-type junction isolation region 140b arranged in the interior zone of the first P-type junction isolation region 140a and working with the first P-type junction isolation region 140a to enclose an isolated region; a high-voltage insulated gate field effect transistor (IGFET) 150 arranged in the isolated region and utilizing the HV-LV junction terminal region 120 as its drift region; wherein, the high-voltage region 110 is partially located in the isolated region, the partial high-voltage region 110 in the isolated region comprises a first N-type deep well 31 arranged in the P-type substrate 1 and a first N-type well region 61 arranged in the P-type epitaxial layer 2, and the N-type well region 61 is on the top surface of the first N-type deep well 31; the partial high-voltage region 110 outside the isolated region comprises a second N-type deep well 32 arranged in the P-type substrate 1 and a second N-type well region 62 arranged in the P-type epitaxial layer 2, and the N-type well region 62 is on the top surface of the second N-type deep well (32); the first N-type deep well 31 extends towards and into the HV-LV junction terminal region 120, the second N-type deep well 32 extends towards and into the HV-LV junction terminal region 120, wherein, the second P-type junction isolation region 140b is a second P-type well region 72 arranged in the P-type epitaxial layer 2, and the second P-type well region 72 is arranged on the surface of the P-type substrate 1; the second P-type well region 72 in a part of the second P-type junction isolation region 140b in the HV-LV junction terminal region 120 is substituted by a N-type well region 5, and the N-type well region 5 is on the P-type epitaxial layer 2 and is surrounded by the second P-type well region 72; the implanted area of the N-type well region 5 in unit area of the second P-type junction isolation region 140b increases gradually in the direction from the high-voltage region 110 to the low-voltage region 130. The implantation windows of the N-type well region 5 are rectangles that are arranged in a row and spaced from each other (see FIG. 1), and in the direction from the high-voltage region 110 to the low-voltage region 130, the implantation windows of the N-type well region 5 are in the same size, but the spacing between the implantation windows of the N-type well region 5 decreases gradually. Since the rectangular implantation windows of the N-type well region 5 are in the same size but are arranged at varying intervals, the implanted area of the N-type well region 5 in unit area of the second P-type junction isolation region 140b increases in the direction from the high-voltage region 110 to the low-voltage region 130; therefore, the concentration of the second P-type well region 72 decreases in the direction from the high-voltage region 110 to the low-voltage region 130. The second P-type well region 72 with gradually decreased concentration can be depleted completely under high voltage; therefore, a partial breakdown phenomenon can be prevented, and the withstand voltage of the isolation structure can be increased.

Embodiment 2

Figure 2:
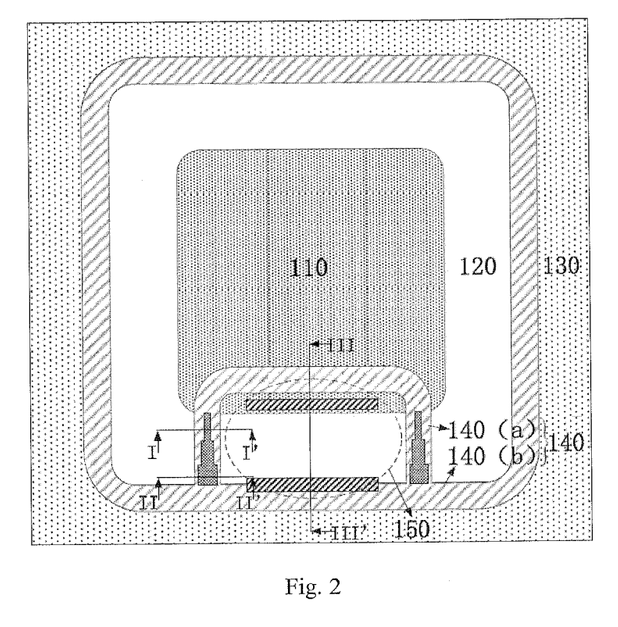
FIG. 2 is a schematic diagram of a second embodiment of the isolation structure in the present invention.

An isolation structure of high-voltage driving circuit, comprising: a P-type substrate 1; a P-type epitaxial layer 2 arranged on the P-type substrate 1; a low-voltage region 130 and a high-voltage region 110 arranged on the P-type epitaxial layer 2; a HV-LV junction terminal region 120 arranged between the low-voltage region 130 and the high-voltage region 110; a first P-type junction isolation region 140a arranged between the HV-LV junction terminal region 120 and the low-voltage region 130, said first P-type junction isolation region 140a being composed of a P-type buried layer 4 and a first P-type well 71; a second P-type junction isolation region 140b arranged in the interior zone of the first P-type junction isolation region 140a and working with the first P-type junction isolation region 140a to enclose an isolated region; a high-voltage insulated gate field effect transistor (IGFET) 150 arranged in the isolated region and utilizing the HV-LV junction terminal region 120 as its drift region; wherein, the high-voltage region 110 is partially located in the isolated region, the partial high-voltage region 110 in the isolated region comprises a first N-type deep well 31 arranged in the P-type substrate 1 and a first N-type well region 61 arranged in the P-type epitaxial layer 2, and the N-type well region 61 is on the top surface of the first N-type deep well 31; the partial high-voltage region 110 outside the isolated region comprises a second N-type deep well 32 arranged in the P-type substrate 1 and a second N-type well region 62 arranged in the P-type epitaxial layer 2, and the N-type well region 62 is on the top surface of the second N-type deep well 32; the first N-type deep well 31 extends towards and into the HV-LV junction terminal region 120, the second N-type deep well 32 extends towards and into the HV-LV junction terminal region 120, wherein, the second P-type junction isolation region 140b is a second P-type well region 72 arranged in the P-type epitaxial layer 2, and the second P-type well region 72 is arranged on the surface of the P-type substrate 1; the second P-type well region 72 in a part of the second P-type junction isolation region 140b in the HV-LV junction terminal region 120 is substituted by a N-type well region 5, and the N-type well region 5 is on the P-type epitaxial layer 2 and is surrounded by the second P-type well region 72; the implanted area of the N-type well region 5 in unit area of the second P-type junction isolation region 140b increases gradually in the direction from the high-voltage region 110 to the low-voltage region 130. The implantation windows of the N-type well region 5 are rectangles that are arranged in a row continuously (see FIG. 2); in the direction from the high-voltage region 110 to the low-voltage region 130, the implantation windows of the N-type well region 5 are narrowed down gradually. Since the rectangular implantation windows of the N-type well region 5 are arranged in a row continuously and are narrowed down gradually, the implanted area of the N-type well region 5 in unit area of the second P-type junction isolation region 140b increases in the direction from the high-voltage region 110 to the low-voltage region 130; therefore, the concentration of the second P-type well region 72 decreases in the direction from the high-voltage region 110 to the low-voltage region 130. The second P-type well region 72 with gradually decreased concentration can be depleted completely under high voltage; therefore, a partial breakdown phenomenon can be prevented, and the withstand voltage of the isolation structure can be increased.

Embodiment 3

Figure 3:
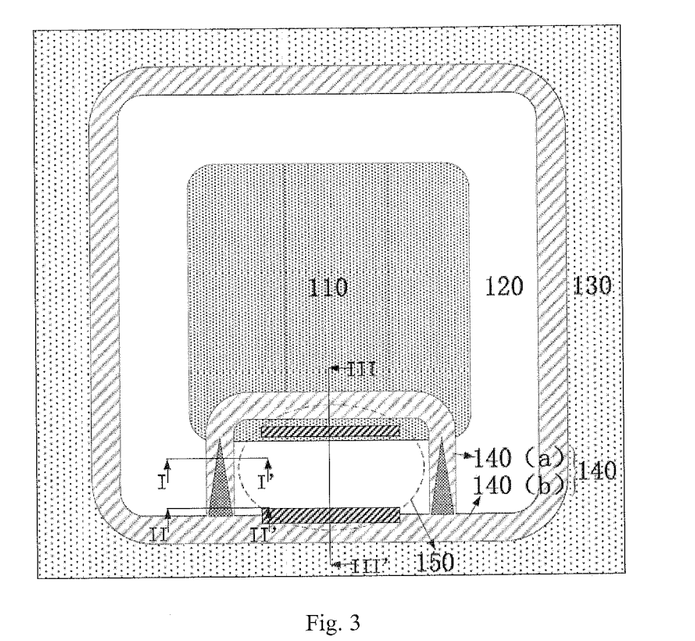
FIG. 3 is a schematic diagram of a third embodiment of the isolation structure in the present invention.

An isolation structure of high-voltage driving circuit, comprising: a P-type substrate 1; a P-type epitaxial layer 2 arranged on the P-type substrate 1; a low-voltage region 130 and a high-voltage region 110 arranged on the P-type epitaxial layer 2; a HV-LV junction terminal region 120 arranged between the low-voltage region 130 and the high-voltage region 110; a first P-type junction isolation region 140a arranged between the HV-LV junction terminal region 120 and the low-voltage region 130, said first P-type junction isolation region 140a being composed of a P-type buried layer 4 and a first P-type well 71; a second P-type junction isolation region 140b arranged in the interior zone of the first P-type junction isolation region 140a and working with the first P-type junction isolation region 140a to enclose an isolated region; a high-voltage insulated gate field effect transistor (IGFET) 150 arranged in the isolated region and utilizing the HV-LV junction terminal region 120 as its drift region; wherein, the high-voltage region 110 is partially located in the isolated region, the partial high-voltage region 110 in the isolated region comprises a first N-type deep well 31 arranged in the P-type substrate 1 and a first N-type well region 61 arranged in the P-type epitaxial layer 2, and the N-type well region 61 is on the top surface of the first N-type deep well 31; the partial high-voltage region 110 outside the isolated region comprises a second N-type deep well 32 arranged in the P-type substrate 1 and a second N-type well region 62 arranged in the P-type epitaxial layer 2, and the N-type well region 62 is on the top surface of the second N-type deep well 32; the first N-type deep well 31 extends towards and into the HV-LV junction terminal region 120, the second N-type deep well 32 extends towards and into the HV-LV junction terminal region 120, wherein, the second P-type junction isolation region 140b is a second P-type well region 72 arranged in the P-type epitaxial layer 2, and the second P-type well region 72 is arranged on the surface of the P-type substrate 1; the second P-type well region 72 in a part of the second P-type junction isolation region 140b in the HV-LV junction terminal region 120 is substituted by a N-type well region 5, and the N-type well region 5 is on the P-type epitaxial layer 2 and is surrounded by the second P-type well region 72; the implanted area of the N-type well region 5 in unit area of the second P-type junction isolation region 140b increases gradually in the direction from the high-voltage region 110 to the low-voltage region 130. The implantation window of the N-type well region 5 is a triangle (see FIG. 3); in the direction from the high-voltage region 110 to the low-voltage region 130, the implantation windows of the N-type well region 5 are triangles. Since the implantation window of the N-type well region 5 is a triangle, the implanted area of the N-type well region 5 in unit area of the second P-type junction isolation region 140b increases in the direction from the high-voltage region 110 to the low-voltage region 130; therefore, the concentration of the second P-type well region 72 decreases in the direction from the high-voltage region 110 to the low-voltage region 130. The second P-type well region 72 with gradually decreased concentration can be depleted completely under high voltage; therefore, a partial breakdown phenomenon can be prevented, and the withstand voltage of the isolation structure can be increased.

Embodiment 4

Figure 4:
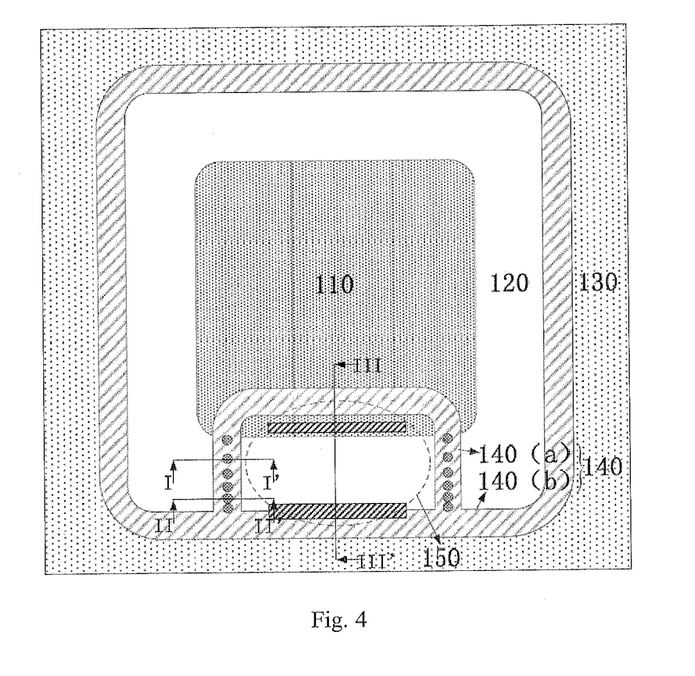
FIG. 4 is a schematic diagram of a fourth embodiment of the isolation structure in the present invention.
Figure 5:
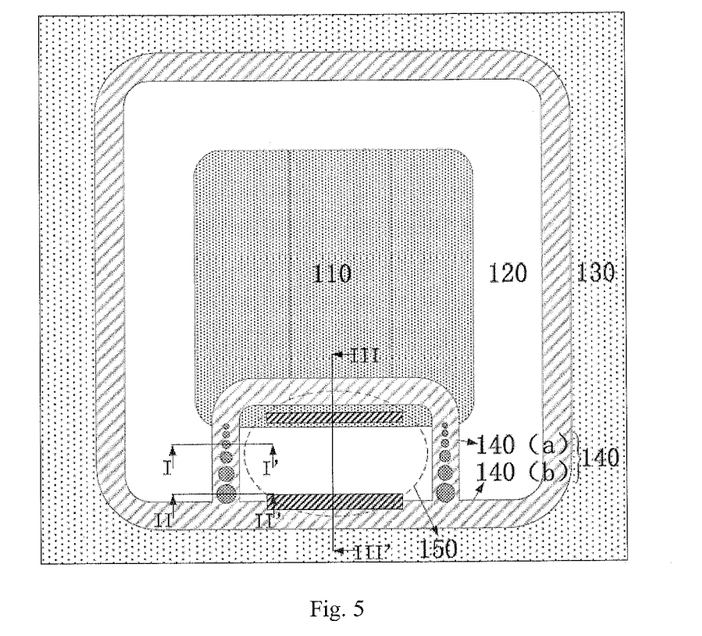
FIG. 5 is a schematic diagram of a fifth embodiment of the isolation structure in the present invention.
Figure 6:
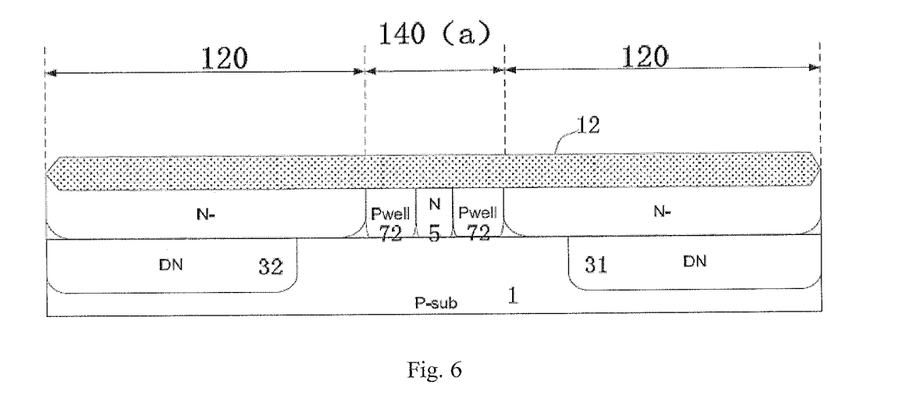
FIG. 6 is a cross sectional view along the line I-I' in FIG. 1, wherein, the isolation structure is indicated as 140(a) and has a N-type buried layer below it.
Figure 7:
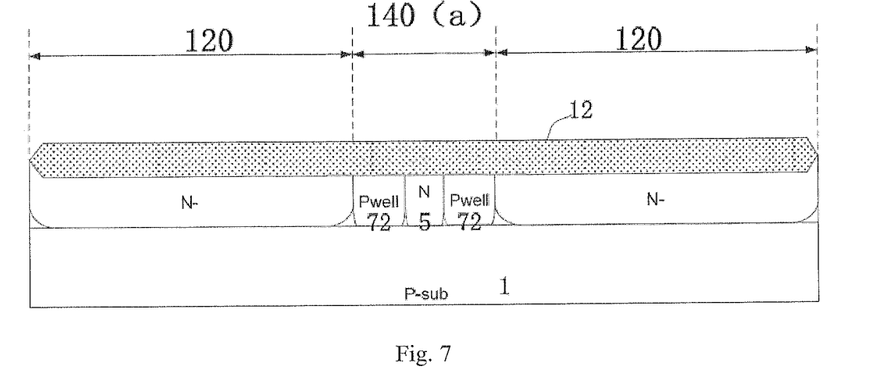
FIG. 7 is a cross sectional view along line II-II' in FIG. 1, wherein, the isolation structure is indicated as 140(a) and has a N-type buried layer below it, and the cross section is near the low-voltage region 130, where no N-type deep well DN exists at either side of the isolation structure.
Figure 8:
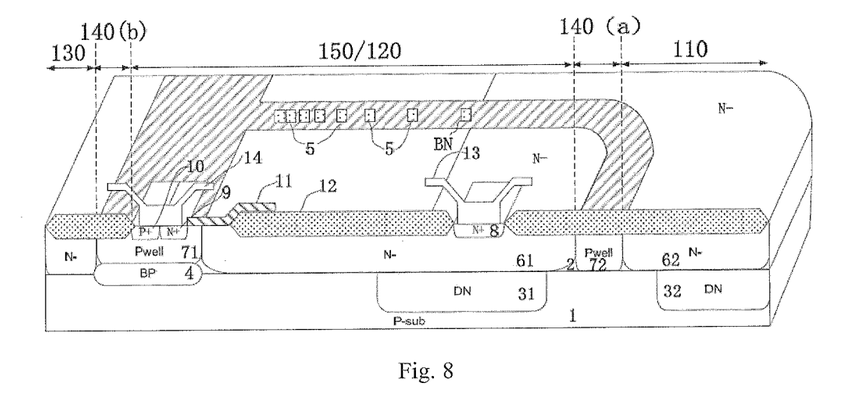
FIG. 8 is a cross sectional view along line in FIG. 1, wherein, 150 is a high-voltage IGFET, which is surrounded by isolation structures 140(a) and 140(b)
Figure 9:
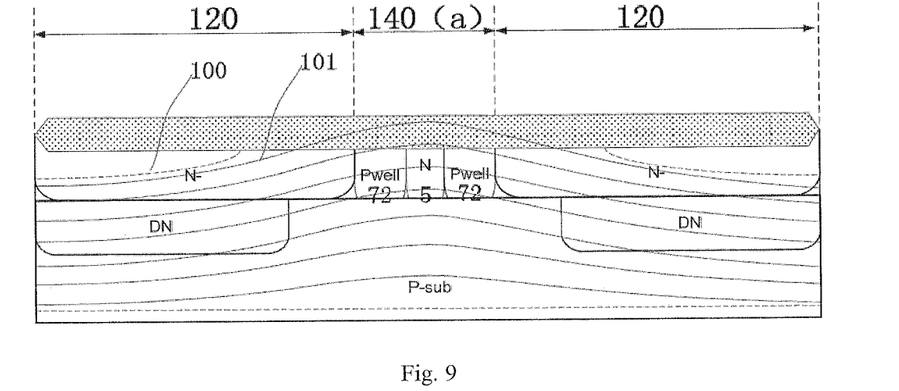
FIG. 9 is a schematic diagram of equipotential lines of an isolation structure with an N-type well region when high voltage is applied across the isolation structure, indicating that the P-type junction isolation region is depleted completely, wherein, the dotted line represents the boundary of the depletion region.

An isolation structure of high-voltage driving circuit, comprising: a P-type substrate 1; a P-type epitaxial layer 2 arranged on the P-type substrate 1; a low-voltage region 130 and a high-voltage region 110 arranged on the P-type epitaxial layer 2; a HV-LV junction terminal region 120 arranged between the low-voltage region 130 and the high-voltage region 110; a first P-type junction isolation region 140a arranged between the HV-LV junction terminal region 120 and the low-voltage region 130, said first P-type junction isolation region 140a being composed of a P-type buried layer 4 and a first P-type well 71; a second P-type junction isolation region 140b arranged in the interior zone of the first P-type junction isolation region 140a and working with the first P-type junction isolation region 140a to enclose an isolated region; a high-voltage insulated gate field effect transistor (IGFET) 150 arranged in the isolated region and utilizing the HV-LV junction terminal region 120 as its drift region; wherein, the high-voltage region 110 is partially located in the isolated region, the partial high-voltage region 110 in the isolated region comprises a first N-type deep well 31 arranged in the P-type substrate 1 and a first N-type well region 61 arranged in the P-type epitaxial layer 2, and the N-type well region 61 is on the top surface of the first N-type deep well 31; the partial high-voltage region 110 outside the isolated region comprises a second N-type deep well 32 arranged in the P-type substrate 1 and a second N-type well region 62 arranged in the P-type epitaxial layer 2, and the N-type well region 62 is on the top surface of the second N-type deep well 32; the first N-type deep well 31 extends towards and into the HV-LV junction terminal region 120, the second N-type deep well 32 extends towards and into the HV-LV junction terminal region 120, wherein, the second P-type junction isolation region 140b is a second P-type well region 72 arranged in the P-type epitaxial layer 2, and the second P-type well region 72 is arranged on the surface of the P-type substrate 1; the second P-type well region 72 in a part of the second P-type junction isolation region 140b in the HV-LV junction terminal region 120 is substituted by a N-type well region 5, and the N-type well region 5 is on the P-type epitaxial layer 2 and is surrounded by the second P-type well region 72; the implanted area of the N-type well region 5 in unit area of the second P-type junction isolation region 140b increases gradually in the direction from the high-voltage region 110 to the low-voltage region 130. The implantation windows of the N-type well region 5 are circles that are arranged in a row and spaced from each other (see FIG. 4 and FIG. 5); in the direction from the high-voltage region to the low-voltage region, the implantation windows of the N-type well region 5 are circles arranged in a row and spaced from each other. The circular implantation windows of the N-type well region 5 are in the same size but are arranged at varying intervals, or increase in size but are arranged at a fixed interval; thus, the implanted area of the N-type well region 5 in unit area of the second P-type junction isolation region 140b increases in the direction from the high-voltage region 110 to the low-voltage region 130; therefore, the concentration of the second P-type well region 72 decreases in the direction from the high-voltage region 110 to the low-voltage region 130. The second P-type well region 72 with gradually decreased concentration can be depleted completely under high voltage; therefore, a partial breakdown phenomenon can be prevented, and the withstand voltage of the isolation structure can be increased.

The method for preparation of the isolation structure of high-voltage driving circuit is as follows:

step 1: prepare a P-type silicon substrate 1; form N-type deep well regions 31 and 32 by growing an oxide layer, depositing silicon nitride, photo-etching, implanting phosphorous ions, and annealing; form a P-type buried layer 4 by removing silicon nitride, photo-etching, implanting boron ions, and annealing;

step 2: grow a P-type epitaxial layer 2; form N-type wells 61 and 62 by growing an oxide layer, depositing silicon nitride, photo-etching, implanting phosphorus ions, and annealing; form a N-type well region 5 by photo-etching, implanting phosphorus ions, and annealing; now, an oxide layer with thickness of 5000 Å is formed on the surface of N-type wells 61 and 62 and N-type well region 5;

step 3: form P-type junction isolation well regions 71 and 72 by etching all silicon nitride, implanting boron ions on the entire surface, and annealing;

step 4: remove the 5000 Å oxide layer; form a field region and an active region by depositing silicon nitride, etching the silicon nitride, and growing a field oxide layer;

step 5: grow a gate oxide layer with thickness of 1000 Å in the active region, implant boron fluoride ions for threshold adjusting, and then deposit and etch a polysilicon gate;

step 6: form a N-type source region 9 and a N-type drain region 8 by photo-etching, and implanting phosphorus and arsenic ions; form a P-type contact region 10 by photo-etching, and implanting boron fluoride ions; deposit a dielectric isolating oxide layer, etch contact holes, deposit metallic aluminum, and etch the aluminum to form metal wires, and finally passivate the dielectric layer.

The invention claimed is:

1. An isolation structure of high-voltage driving circuit, comprising: a P-type substrate; a P-type epitaxial layer arranged on the P-type substrate; a low-voltage region and a high-voltage region arranged on the P-type epitaxial layer; a HV-LV junction terminal region arranged between the low-voltage region and the high-voltage region; a first P-type junction isolation region arranged between the HV-LV junction terminal region and the low-voltage region, said first P-type junction isolation region being composed of a P-type buried layer and a first P-type well; a second P-type junction isolation region arranged in the interior zone of the first P-type junction isolation region and working with the first P-type junction isolation region to enclose an isolated region; a high-voltage insulated gate field effect transistor (IGFET)

arranged in the isolated region and utilizing the HV-LV junction terminal region as its drift region; wherein, the high-voltage region is partially located in the isolated region, the partial high-voltage region in the isolated region comprises a first N-type deep well arranged in the P-type substrate and a first N-type well region arranged in the P-type epitaxial layer, and the N-type well region is on the top surface of the first N-type deep well; the partial high-voltage region outside of the isolated region comprises a second N-type deep well arranged in the P-type substrate and a second N-type well region arranged in the P-type epitaxial layer, and the N-type well region is the top surface of the second N-type deep well; the first N-type deep well extends towards and into the HV-LV junction terminal region, the second N-type deep well extends towards and into the HV-LV junction terminal region, wherein, the second P-type junction isolation region is a second P-type well region arranged in the P-type epitaxial layer, and the second P-type well region is arranged on the surface of the P-type substrate; the second P-type well region in a part of the second P-type junction isolation region in the HV-LV junction terminal region is substituted by a N-type well region, and the N-type well region is on the P-type epitaxial layer and is surrounded by the second P-type well region; the implanted area of the N-type well region in unit area of the second P-type junction isolation region increases gradually in the direction from the high-voltage region to the low-voltage region.

2. The isolation structure of high-voltage driving circuit according to claim 1, wherein, the implantation windows of the N-type well region are rectangles arranged in a row and spaced from each other.

3. The isolation structure of high-voltage driving circuit according to claim 1, wherein, the implantation windows of the N-type well region are rectangles arranged in a row continuously.

4. The isolation structure of high-voltage driving circuit according to claim 1, wherein, the implantation windows of the N-type well region are formed as a triangle.

5. The isolation structure of high-voltage driving circuit according to claim 1, wherein, the implantation windows of the N-type well region are circles arranged in a row and spaced from each other.

6. A method for preparation of the isolation structure of high-voltage driving circuit as claimed in claim 1, comprising the following steps:
   step 1: preparing a P-type silicon substrate; forming N-type deep well regions and by growing an oxide layer, depositing silicon nitride, photo-etching, implanting phosphorous ions, and annealing; forming a P-type buried layer by removing silicon nitride, photo-etching, implanting boron ions, and annealing;
   step 2: growing a P-type epitaxial layer; forming N-type wells by growing an oxide layer, depositing silicon nitride, photo-etching, implanting phosphorus ions, and annealing; forming a N-type well region by photo-etching, implanting phosphorus ions, and annealing; now, an oxide layer with thickness of 5000 Å is formed on the surface of N-type wells and N-type well region;
   step 3: forming P-type junction isolation regions by etching all silicon nitride, implanting boron ions on the entire surface, and annealing;
   step 4: removing the 5000 Å oxide layer; forming a field region and an active region by depositing silicon nitride, etching the silicon nitride, and growing a field oxide layer;
   step 5: growing a gate oxide layer with thickness of 1000 Å in the active region, implanting boron fluoride ions for threshold adjusting, and then depositing and etching a polysilicon gate;
   step 6: forming a N-type source region and a N-type drain region by photo-etching, and implanting phosphorus and arsenic ions; forming a P-type contact region by photo-etching, and implanting boron fluoride ions; depositing a dielectric isolating oxide layer, etching contact holes, depositing metallic aluminum, and etching the aluminum to form metal wires, and finally passivating the dielectric layer.

7. A method for preparation of the isolation structure of high-voltage driving circuit as claimed in claim 2, comprising the following steps:
   step 1: preparing a P-type silicon substrate; forming N-type deep well regions and by growing an oxide layer, depositing silicon nitride, photo-etching, implanting phosphorous ions, and annealing; forming a P-type buried layer by removing silicon nitride, photo-etching, implanting boron ions, and annealing;
   step 2: growing a P-type epitaxial layer; forming N-type wells by growing an oxide layer, depositing silicon nitride, photo-etching, implanting phosphorus ions, and annealing; forming a N-type well region by photo-etching, implanting phosphorus ions, and annealing; now, an oxide layer with thickness of 5000 Å is formed on the surface of N-type wells and N-type well region;
   step 3: forming P-type junction isolation regions by etching all silicon nitride, implanting boron ions on the entire surface, and annealing;
   step 4: removing the 5000 Å oxide layer; forming a field region and an active region by depositing silicon nitride, etching the silicon nitride, and growing a field oxide layer;
   step 5: growing a gate oxide layer with thickness of 1000 Å in the active region, implanting boron fluoride ions for threshold adjusting, and then depositing and etching a polysilicon gate;
   step 6: forming a N-type source region and a N-type drain region by photo-etching, and implanting phosphorus and arsenic ions; forming a P-type contact region by photo-etching, and implanting boron fluoride ions; depositing a dielectric isolating oxide layer, etching contact holes, depositing metallic aluminum, and etching the aluminum to form metal wires, and finally passivating the dielectric layer.

8. A method for preparation of the isolation structure of high-voltage driving circuit as claimed in claim 3, comprising the following steps:
   step 1: preparing a P-type silicon substrate; forming N-type deep well regions and by growing an oxide layer, depositing silicon nitride, photo-etching, implanting phosphorous ions, and annealing; forming a P-type buried layer by removing silicon nitride, photo-etching, implanting boron ions, and annealing;
   step 2: growing a P-type epitaxial layer; forming N-type wells by growing an oxide layer, depositing silicon nitride, photo-etching, implanting phosphorus ions, and annealing; forming a N-type well region by photo-etching, implanting phosphorus ions, and annealing; now, an oxide layer with thickness of 5000 Å is formed on the surface of N-type wells and N-type well region;
   step 3: forming P-type junction isolation regions by etching all silicon nitride, implanting boron ions on the entire surface, and annealing;

step 4: removing the 5000 Å oxide layer; forming a field region and an active region by depositing silicon nitride, etching the silicon nitride, and growing a field oxide layer;

step 5: growing a gate oxide layer with thickness of 1000 Å in the active region, implanting boron fluoride ions for threshold adjusting, and then depositing and etching a polysilicon gate;

step 6: forming a N-type source region and a N-type drain region by photo-etching, and implanting phosphorus and arsenic ions; forming a P-type contact region by photo-etching, and implanting boron fluoride ions; depositing a dielectric isolating oxide layer, etching contact holes, depositing metallic aluminum, and etching the aluminum to form metal wires, and finally passivating the dielectric layer.

9. A method for preparation of the isolation structure of high-voltage driving circuit as claimed in claim 4, comprising the following steps:

step 1: preparing a P-type silicon substrate; forming N-type deep well regions and by growing an oxide layer, depositing silicon nitride, photo-etching, implanting phosphorous ions, and annealing; forming a P-type buried layer by removing silicon nitride, photo-etching, implanting boron ions, and annealing;

step 2: growing a P-type epitaxial layer; forming N-type wells by growing an oxide layer, depositing silicon nitride, photo-etching, implanting phosphorus ions, and annealing; forming a N-type well region by photo-etching, implanting phosphorus ions, and annealing; now, an oxide layer with thickness of 5000 Å is formed on the surface of N-type wells and N-type well region;

step 3: forming P-type junction isolation regions by etching all silicon nitride, implanting boron ions on the entire surface, and annealing;

step 4: removing the 5000 Å oxide layer; forming a field region and an active region by depositing silicon nitride, etching the silicon nitride, and growing a field oxide layer;

step 5: growing a gate oxide layer with thickness of 1000 Å in the active region, implanting boron fluoride ions for threshold adjusting, and then depositing and etching a polysilicon gate;

step 6: forming a N-type source region and a N-type drain region by photo-etching, and implanting phosphorus and arsenic ions; forming a P-type contact region by photo-etching, and implanting boron fluoride ions; depositing a dielectric isolating oxide layer, etching contact holes, depositing metallic aluminum, and etching the aluminum to form metal wires, and finally passivating the dielectric layer.

10. A method for preparation of the isolation structure of high-voltage driving circuit as claimed in claim 5, comprising the following steps:

step 1: preparing a P-type silicon substrate; forming N-type deep well regions and by growing an oxide layer, depositing silicon nitride, photo-etching, implanting phosphorous ions, and annealing; forming a P-type buried layer by removing silicon nitride, photo-etching, implanting boron ions, and annealing;

step 2: growing a P-type epitaxial layer; forming N-type wells by growing an oxide layer, depositing silicon nitride, photo-etching, implanting phosphorus ions, and annealing; forming a N-type well region by photo-etching, implanting phosphorus ions, and annealing; now, an oxide layer with thickness of 5000 Å is formed on the surface of N-type wells and N-type well region;

step 3: forming P-type junction isolation regions by etching all silicon nitride, implanting boron ions on the entire surface, and annealing;

step 4: removing the 5000 Å oxide layer; forming a field region and an active region by depositing silicon nitride, etching the silicon nitride, and growing a field oxide layer;

step 5: growing a gate oxide layer with thickness of 1000 Å in the active region, implanting boron fluoride ions for threshold adjusting, and then depositing and etching a polysilicon gate;

step 6: forming a N-type source region and a N-type drain region by photo-etching, and implanting phosphorus and arsenic ions; forming a P-type contact region by photo-etching, and implanting boron fluoride ions; depositing a dielectric isolating oxide layer, etching contact holes, depositing metallic aluminum, and etching the aluminum to form metal wires, and finally passivating the dielectric layer.

* * * * *